(12) United States Patent
Nogome et al.

(10) Patent No.: US 7,091,528 B2
(45) Date of Patent: Aug. 15, 2006

(54) SEMICONDUCTOR DEVICE

(75) Inventors: Masanobu Nogome, Bizen (JP);
Akiyoshi Tamura, Suita (JP); Keiichi Murayama, Okayama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/902,120

(22) Filed: Jul. 30, 2004

(65) Prior Publication Data

US 2005/0145884 A1 Jul. 7, 2005

(30) Foreign Application Priority Data

Jan. 7, 2004 (JP) ............................. 2004-001907

(51) Int. Cl.
*H01L 31/328* (2006.01)
(52) U.S. Cl. ........................................ 257/197; 257/198
(58) Field of Classification Search ................. 257/197
See application file for complete search history.

(56) References Cited

U.S. PATENT DOCUMENTS

| | | | |
|---|---|---|---|
| 5,106,766 A | 4/1992 | Lunardi et al. | |
| 5,684,310 A | 11/1997 | Liu | |
| 6,531,721 B1 * | 3/2003 | Burton et al. | 257/197 |
| 6,881,988 B1 | 4/2005 | Niwa et al. | |
| 6,903,388 B1 * | 6/2005 | Murayama et al. | 257/197 |
| 2003/0136956 A1 | 7/2003 | Niwa et al. | |
| 2004/0065897 A1 * | 4/2004 | Lee et al. | 257/197 |

FOREIGN PATENT DOCUMENTS

| | | |
|---|---|---|
| EP | 1 329 959 | 7/2003 |
| JP | 63-239983 | 10/1988 |
| JP | 5-41388 | 2/1993 |
| JP | 7-161727 | 6/1995 |
| JP | 2001-326231 | 11/2001 |
| JP | 2003-218123 | 7/2003 |
| WO | 98/09335 | 3/1998 |

OTHER PUBLICATIONS

Niwa T et al, Institute of Electrical and Electronics Engineers: "A Composite-Collector InGaP/GaAs HBT with High Ruggedness for GSM Power Amplifiers" 2003 IEEE MTT-S International Microwave Symposium Digest. (IMS 2003). Philadelphia, PA, Jun. 8-13, 2003, IEEE MTT-S International Microwave Symposium, New York, NY: IEEE, US, vol. 3 of 3, Jun. 8, 2003, pp. 711-714, XP010645007.

(Continued)

*Primary Examiner*—David Nelms
*Assistant Examiner*—Dao H. Nguyen
(74) *Attorney, Agent, or Firm*—Wenderoth, Lind, & Ponack, L.L.P.

(57) ABSTRACT

A semiconductor device is provided having an improved breakdown voltage on high power output, the semiconductor device comprising a n-type GaAs subcollector layer, a n-type GaAs intermediate collector layer formed between a collector layer and the subcollector layer, the n-type GaAs collector layer, a p-type GaAs base layer, a n-type InGaP second emitter layer, a n-type GaAs first emitter layer, and a n-type InGaAs emitter contact layer, and a concentration of impurities in the intermediate collector layer is higher than a concentration of impurities in the collector layer and is lower than a concentration of impurities in the subcollector layer.

9 Claims, 8 Drawing Sheets

OTHER PUBLICATIONS

Pfost M et al: "Optimization of the Collector Profile of InGaP/GaAs HBTs for Increased Robustness" IEEE GAAS DIGEST, Nov. 9, 2003, pp. 115-118, XP010673642.

Gao G B et al: "Double-Layer Collector for Heterojunction Bipolar Transistors" Solid State Electronics, Elsevier Science Publishers, Barking, GB, vol. 35, No. 1, Jan. 1992, pp. 57-60, XP000242020.

Lew K L et al: "Effect of composite collector design on the breakdown behavior of InGap/GaAs double heterojunction bipolar transistor" Journal of Applied Physics, American Institute of Physics. New York, US, vol. 93, No. 1, Jan. 1, 2003, pp. 605-610, XP012057716.

Shahidul Hassan M M et al: "Increase of Critical Current Density and Voltage for Triggering Avalanche Injection Through Use of Graded Collector Doping" Microelectronics and Reliability, Pergamon Press. Oxford, GB, vol. 29, No. 2, 1989, pp. 217-226, XP000031158.

* cited by examiner

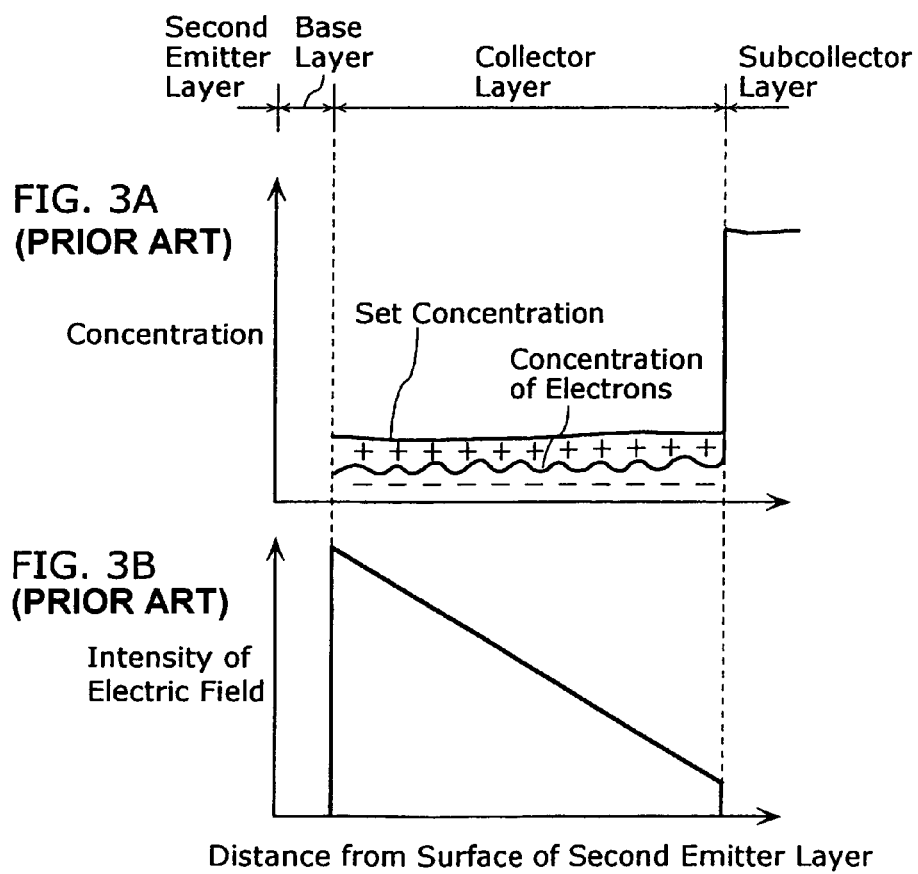

FIG. 4A (PRIOR ART)
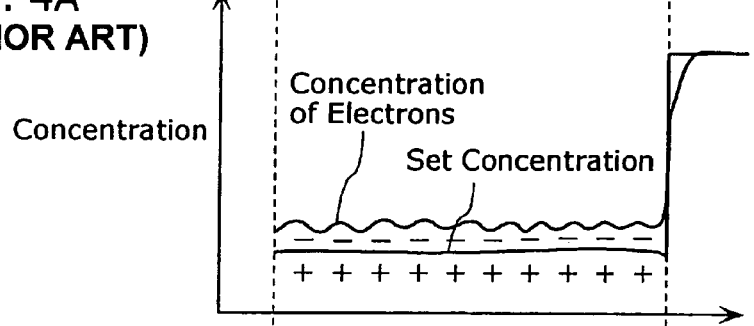
FIG. 4B (PRIOR ART)
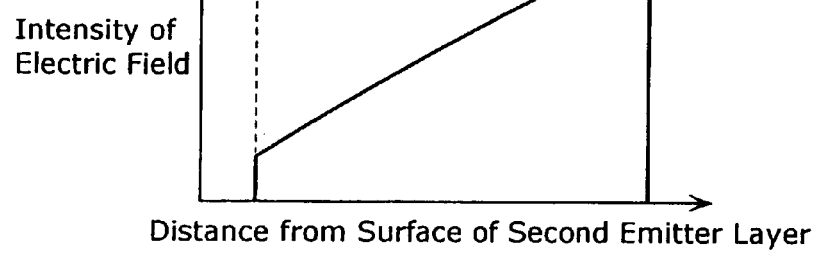

Distance from Surface of Second Emitter Layer

Distance from Surface of Second Emitter Layer

SEMICONDUCTOR DEVICE

BACKGROUND OF THE INVENTION (1) Field of the Invention

The present invention relates to a heterojunction bipolar transistor which has been widely used for a communication transmitting high power amplifier.

(2) Description of the Related Art

Conventionally, a compound semiconductor device such as a Field-Effect Transistor (hereafter referred to as FET) and a Heterojunction Bipolar Transistor (hereafter referred to as HBT) have been used for a communication transmitting high power amplifier that is one of the components of a cellular phone, and the like.

FIG. 1 is a cross-section diagram showing a device structure of a typical conventional HBT (e.g. refer to Japanese Laid-Open Patent Publication No. 2001-326231).

As shown in FIG. 1, in the conventional HBT, by a crystal growth using a MOCVD method (Metal Organic Chemical Vapor Depoint method) or a MBE method (Molecular-Beam Epitaxial method), the following layers are sequentially laminated on a semi-insulating GaAs substrate 500, the layers being a n-type GaAs subcollector layer 501 with a thickness of 6000 Å formed by doping n-type impurities at a concentration of $4\times10^{18}$ cm$^{-3}$, a n-type GaAs collector layer 502 with a thickness of 6000 Å formed by doping n-type impurities at a concentration of $1\times10^{16}$ cm$^{-3}$, a p-type GaAs base layer 503, a n-type InGaP second emitter layer 504, a n-type GaAs first emitter layer 505, and a n-type InGaAs emitter contact layer 506. Also, an emitter electrode 507, a base electrode 508 and a collector electrode 509 are respectively formed on the emitter contact layer 506, the base layer 503 and the subcollector layer 501 that are formed by process technologies such as lithography, etching and evaporation.

Next, an evaluation result on typical electric characteristics of a conventional HBT having the structure mentioned above is explained.

FIG. 2A is a "Gummel plot" that indicates dependencies of a collector current $I_c$ and a base current $I_b$ on a voltage $V_{be}$ in the case where the base and the collector are connected to a common electrode. FIG. 2B is a diagram indicating characteristics of a collector-emitter voltage $V_{ce}$ and a collector current $I_c$ with grounded emitter. In FIG. 2A, a solid line indicates $I_c$ and a dotted line indicates $I_b$. Also, in FIG. 2B, the $I_c$-$V_{ce}$ characteristic is seen at the $I_b$ which is different points at 0, $I_{bm}/10$, $I_{bm}/2$ and $I_{bm}$, and $I_{bm}$ indicates the maximum value of $I_b$ in FIG. 2B.

FIG. 2B shows that, when the $V_{ce}$ increases and reaches a certain value, $I_c$ suddenly increases and a HBT breaks down. This phenomenon that $I_c$ suddenly increases at a certain $V_{ce}$ is called an avalanche breakdown. The avalanche breakdown is a phenomenon of generating an electron and a hole one after another by electrons running rapidly in the collector layer to collide with ambient atoms when a state of reserve bias between the collector and the base is intensified and gradually the intensity of the electric field is increased to the extent. It is also called impact ionization. Here, a current at which the avalanche breakdown occurs is generally expressed as in the following (1) equation by applying $\alpha_n$ and $\alpha_p$ respectively to impact ionization coefficients of an electron and a hole and applying $J_n$ and $J_p$ respectively to current densities of the electron and the hole.

$$\alpha_n J_n + \alpha_p J_p \quad (1)$$

Such avalanche breakdown occurs resulting from a presence of carriers of the electron, the hole and the like, and of an intensity of the electric field in a channel. Accordingly, the greater the number of carriers increases, the more likely the avalanche breakdown occurs. In addition, the stronger the intensity of the electric field is, the more likely the avalanche breakdown occurs. In FIG. 2B, the former is seen from that $V_{ce}$ at which the avalanche breakdown occurs is the minimum at $I_b=I_{bm}$ when $I_c$ is the maximum. In FIG. 2B, the latter is seen from that the avalanche breakdown occurs when the intensity of the electric field reaches the intensity of a critical electric field ($4\times10^5$ V/cm) even at $I_b=0$ where there are no carriers.

By the way, in recent years, there has been a demand for the HBT to have great characteristics of high power outputs, high gains and low distortions. For example, the high power output is especially required in the case where the HBT is commercially used as a communication transmitting high power amplifier for a cellular phone of a GSM system but not of the conventional CDMA system.

However, the conventional HBT as shown in FIG. 2B has a problem that a breakdown is likely to occur as $I_c$ increases. In other words, a breakdown voltage is lowered on high power output.

In here, a state inside a device when the conventional HBT breaks down is explained with reference to FIGS. 3A and 3B, and FIGS. 4A and 4B.

FIG. 3A and FIG. 4A are diagrams showing a concentration of donors ionized in positive (hereafter referred to as set concentration) and a concentration of electrons that are negative. FIG. 3B and FIG. 4B are diagrams showing an intensity of an electric field (absolute value). In FIG. 3A and FIG. 4A, the horizontal axis indicates a distance from the surface of the second emitter layer 504 and the ordinate axis indicates the concentration. In FIG. 3B and FIG. 4B, the horizontal axis indicates a distance from the surface of the second emitter layer 504 and the ordinate axis indicates the intensity of the electric field. Also, FIGS. 3A and 3B are the cases where $I_c$ is low, that is, where $I_b$ is $I_{bm}/10$ in FIG. 2B. FIGS. 4A and 4B are the cases where $I_c$ is high, that is, where $I_b$ is $I_{bm}$ in FIG. 2B.

FIG. 3A shows that, when current is low, the set concentration is higher than the concentration of electrons in the collector layer 502 and that inside the collector layer 502 is charged in positive. In here, although it is not shown in the diagram, there is a thin layer of an acceptor ionized and charged in negative on the side of the collector layer 502 of the base layer 503. The negative charges in the surface of the base layer 503 are proportional to the positive charges in the collector layer 502.

FIG. 3B shows that, when current is low, a high electric field equivalent to an intensity of a critical electric field is generated at the interface between the base layer 503 and the collector layer 502 and that an avalanche breakdown occurs. In here, a gradient of the electric field indicates the set concentration. The gradient gets steeper as the set concentration gets higher so that the avalanche breakdown occurs at lower $V_{ce}$. In addition, the value obtained by integrating the intensity of the electric field, that is, an area, indicates a voltage applied between the base and the collector. Therefore, the larger the area at the time when the avalanche breakdown occurs is, the higher the breakdown voltage is.

FIG. 4A shows that, when current is high, the set concentration is lower than the concentration of electrons in the collector layer 502 and that inside the collector layer 502 is charged in negative. In here, although it is not shown in the diagram, there is a layer charged in positive on the side of the collector layer 502 of the subcollector layer 501. The positive charges in the surface of the subcollector layer 501 are proportional to the negative charges in the collector layer 502.

FIG. 4B shows that, when current is high, the maximum electric field is generated at an interface between the subcollector layer 501 and the collector layer 502 and that the avalanche breakdown occurs (Kirk effect). At this time, the concentration of electrons in the subcollector layer 501 is high and the avalanche breakdown is likely to occur so that the maximum intensity of the electric field is lower than the intensity of the critical electric field. Note that, the phenomenon is explained in detail in the following reference book: William Liu, "Fundamentals of III–V Devices", pp. 190.

From the above explanations, it is found that, when $I_c$ is high, the breakdown of HBT results from a generation of the maximum electric field on an interface between the subcollector layer and the collector layer.

SUMMARY OF THE INVENTION

Considering the above mentioned problems, it is the object of the present invention to provide a semiconductor device having improved breakdown voltage on high power output.

In order to achieve the object, the semiconductor device of the present invention is a heterojunction bipolar transistor, comprising: a collector layer; a subcollector layer; and an intermediate collector layer formed between the collector layer and the subcollector layer, wherein a concentration of impurities in the intermediate collector layer is higher than a concentration of impurities in the collector layer and is lower than a concentration of impurities in the subcollector layer. Here, the collector layer, the subcollector layer and the intermediate collector layer may be made of GaAs. Also, a thickness of the intermediate collector layer may be one-third or less of a thickness of the collector layer.

Accordingly, the semiconductor device of the present invention can prevent the generation of the maximum electric field and the avalanche breakdown in the subcollector layer on high power output. As the result, the semiconductor device having an improved breakdown voltage on high power output can be realized.

Here, the concentration of impurities in the intermediate collector layer may be higher in a direction from a surface of the intermediate collector layer facing to the collector layer toward a surface of the intermediate layer facing to the subcollector layer. Also, the concentration of impurities in the intermediate collector layer may change step by step from the surface of the intermediate collector layer facing to the collector layer toward the surface of the intermediate collector layer facing to the subcollector layer.

Consequently, the intensity of the electric field in the subcollector layer is lowered and the occurrence of the avalanche breakdown is prevented so that a semiconductor device having further improved breakdown voltage on high power output can be realized.

Further, the collector layer and the subcollector layer may be made of GaAs and the intermediate collector layer may be made of a semiconductor material whose band gap is larger than a band gap of GaAs. Also, the intermediate collector layer may be made of InGaP or InGaAsP.

Consequently, the carrier generation rate is reduced and the occurrence of the avalanche breakdown is prevented so that a semiconductor device having further improved breakdown voltage on high power output can be realized.

As is clear from the above explanation, the semiconductor device according to the present invention can realize a heterojunction bipolar transistor having the improved breakdown voltage on high power output.

Accordingly, the present invention makes it possible to provide the heterojunction bipolar transistor having the improved breakdown voltage on high power output. As a result, it is possible to realize a heterojunction bipolar transistor that can be commercially utilized as a power device of a terminal transmitter of the GSM system. Therefore, its practical value is very high.

As further information about the technical background to this application, the disclosure of Japanese Patent Application No. 2004-001907 filed on Jan. 7, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 3A is a diagram indicating a set concentration and a concentration of electrons in a collector layer of the conventional HBT when current is low.

FIG. 3B is a diagram indicating an intensity of an electric field (absolute value) in the collector layer of the conventional HBT when current is low.

FIG. 4A is a diagram indicating the set concentration and the concentration of electrons in the collector layer of the conventional HBT when current is high.

FIG. 4B is a diagram indicating the intensity of the electric field (absolute value) in the collector layer of the conventional HBT when current is high.

DESCRIPTION OF THE PREFERRED EMBODIMENT

The following describes a semiconductor device according to the embodiment of the present invention with reference to the drawings.

Figure 5:
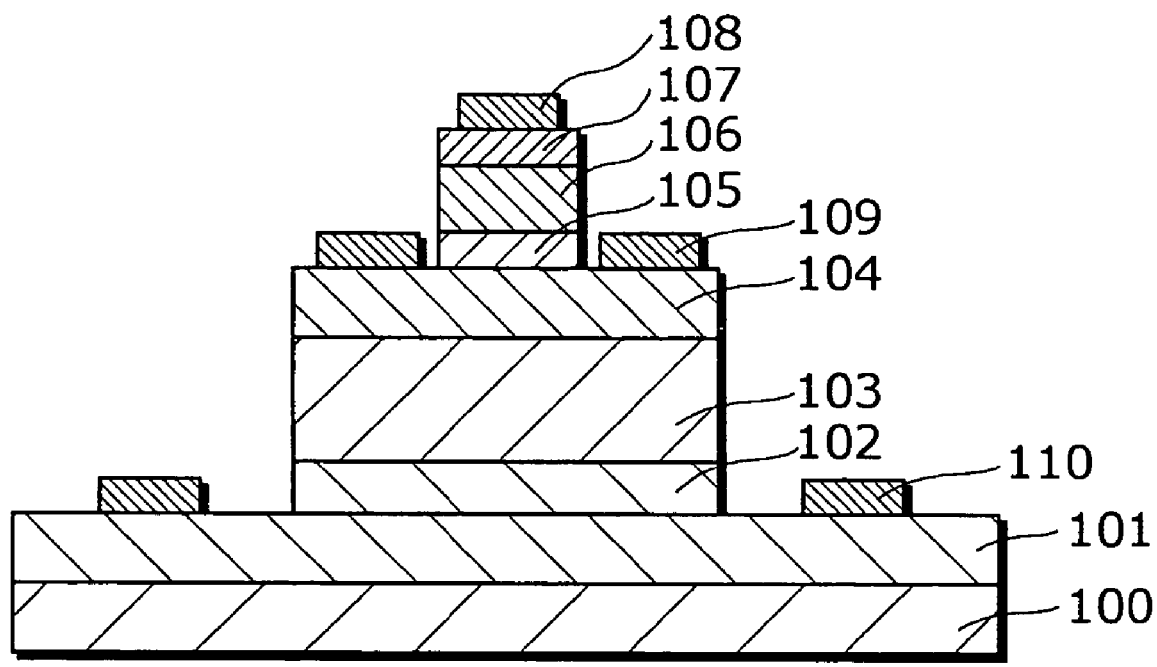
FIG. 5 is a cross-section diagram showing a device structure of a HBT according to an embodiment of the present invention.

FIG. 5 is a cross-section diagram showing a device structure of a HBT in the present embodiment.

The HBT in the present embodiment is aimed to realize a HBT having an improved breakdown voltage on high power output. In the HBT, the following layers are sequentially laminated on a semi-insulating GaAs substrate 100, by a crystal growth using a MOCVD method (Metal Organic Chemical Vapor Depoint method) or a MBE method (Molecular-Beam Epitaxial method), the layers being a n-type GaAs subcollector layer 101 with a thickness of 6000 Å formed by doping n-type impurities at a concentration of $4 \times 10^{18}$ cm$^{-3}$, a n-type GaAs intermediate collector layer 102, a n-type GaAs collector layer 103 with a thickness of 4500 Å formed by doping n-type impurities at a concentration of $1 \times 10^{16}$ cm$^{-3}$, a p-type GaAs base layer 104, a n-type InGaP second emitter layer 105, a n-type GaAs first emitter layer 106, and a n-type InGaAs emitter contact layer 107. Also, an emitter electrode 108, a base electrode 109, and a collector electrode 110 are respectively formed on a emitter contact layer 107, a base layer 104 and a subcollector layer 101 by being formed using process technologies such as lithography, etching and evaporation.

In here, the concentration of impurities in the intermediate collector layer 102 is higher than that of the collector layer 103 and is lower than that of the subcollector layer 101. For example, it is set as $5 \times 10^{16}$ cm$^{-3}$. Further, when the thickness of the intermediate collector layer 102 is one-third or more of the thickness of the collector layer 103, the concentration of electrons increases so as to increase the concentration of carriers. Therefore, it is determined as one-third or less of the thickness of the collector layer 103. For example, it is set as 1500 Å.

Next, a state inside a device when the HBT having the above mentioned structure breaks down is explained with reference to FIGS. 6A and 6B.

Figure 6A:
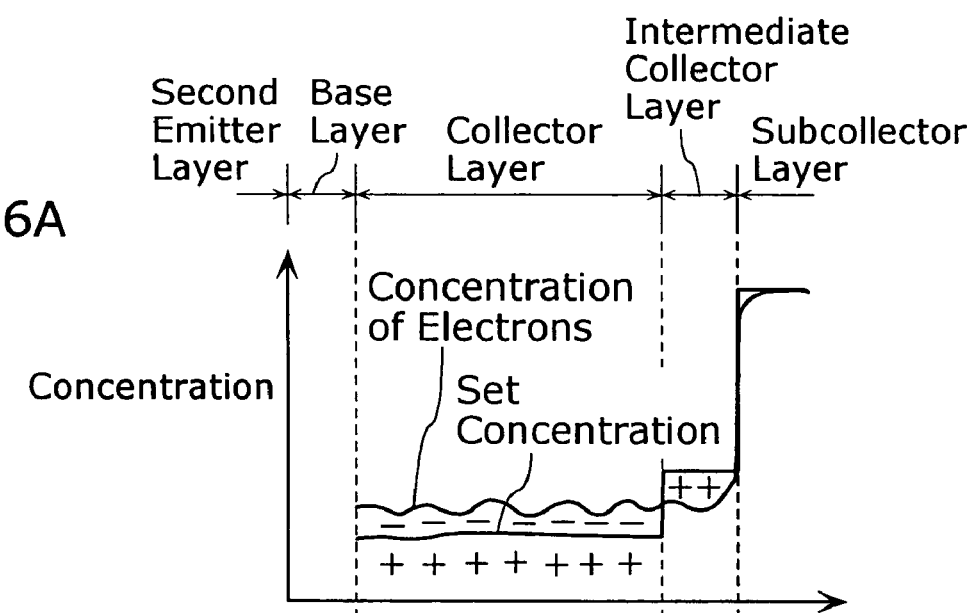
FIG. 6A is a diagram indicating, when current is high, a set concentration and a concentration of electrons in an intermediate collector layer 102 and a collector layer 103 of the HBT in the present embodiment.

FIG. 6A is a diagram indicating a set concentration and a concentration of electrons in the device when current is high. FIG. 6B is a diagram indicating an intensity of an electric field (absolute value) in the device when current is high. In FIG. 6A, the horizontal axis indicates a distance from the surface of the second emitter layer 105 and the ordinate axis indicates the concentrations. In FIG. 6B, the horizontal axis indicates a distance from the surface of the second emitter layer 105 and the ordinate axis indicates the intensity of the electric field.

FIG. 6A shows that, when current is high, the set concentration is lower than the concentration of electrons in the collector layer 103 and that inside the collector layer 103 is charged in negative. On the other hand, it shows that the set concentration is higher than the concentration of electrons in the intermediate collector layer 102 and that inside the intermediate collector layer 102 is charged in positive.

Figure 6B:
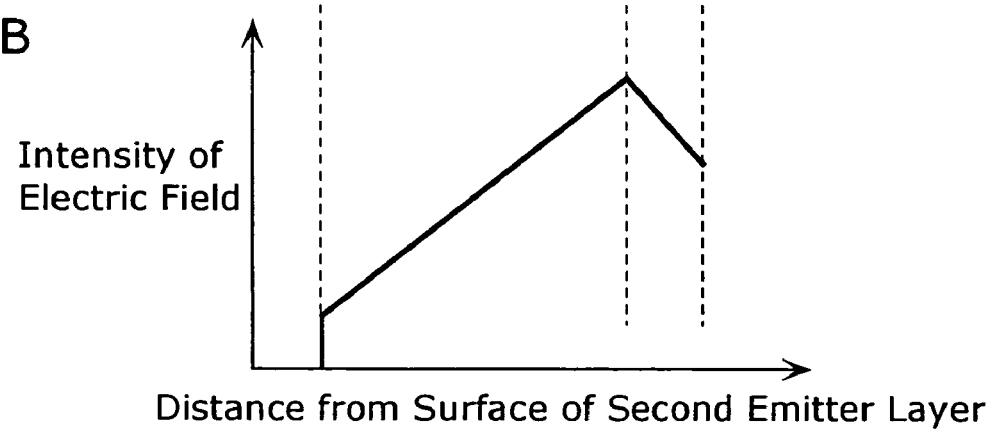
FIG. 6B is a diagram indicating, when current is high, an intensity of an electric field (absolute value) in the intermediate collector layer and the collector layer of the HBT in the embodiment.

FIG. 6B shows that, when current is high, the maximum electric field is generated at an interface between the collector layer 103 and the intermediate collector layer 102 and that the maximum electric field is generated at the place which is apart from the subcollector layer 101. That is, the avalanche breakdown is unlikely to occur. At this time when the concentration of impurities in the intermediate collector layer 102 is high, the avalanche breakdown occurs as a result of the generation of the maximum electric field at the interface between the intermediate collector layer 102 and the collector layer 103.

Next, an electric characteristic of the HBT having the above mentioned structure is explained.

Figure 1:
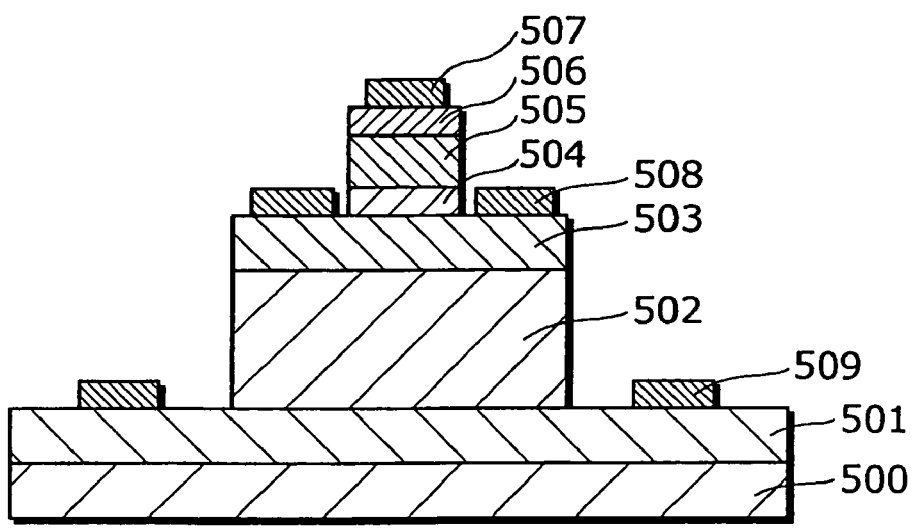
FIG. 1 is a cross-section diagram showing a device structure of a conventional HBT.
Figure 2A:
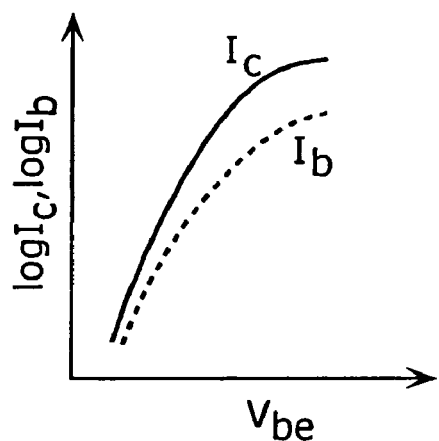
FIG. 2A is a diagram showing a Gummel plot of the conventional HBT.
Figure 2B:
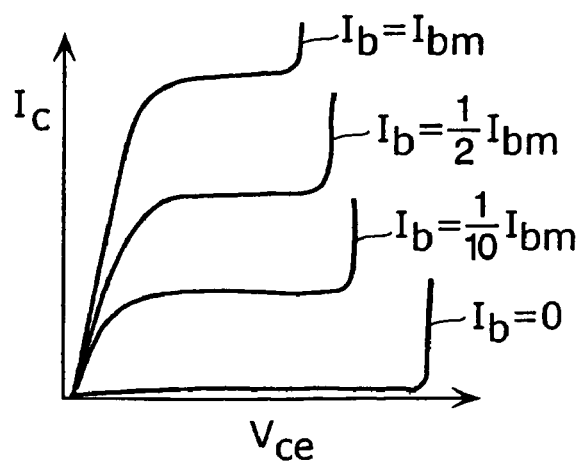
FIG. 2B is a diagram showing an $I_c$-$V_{ce}$ characteristic of the conventional HBT.
Figure 7:
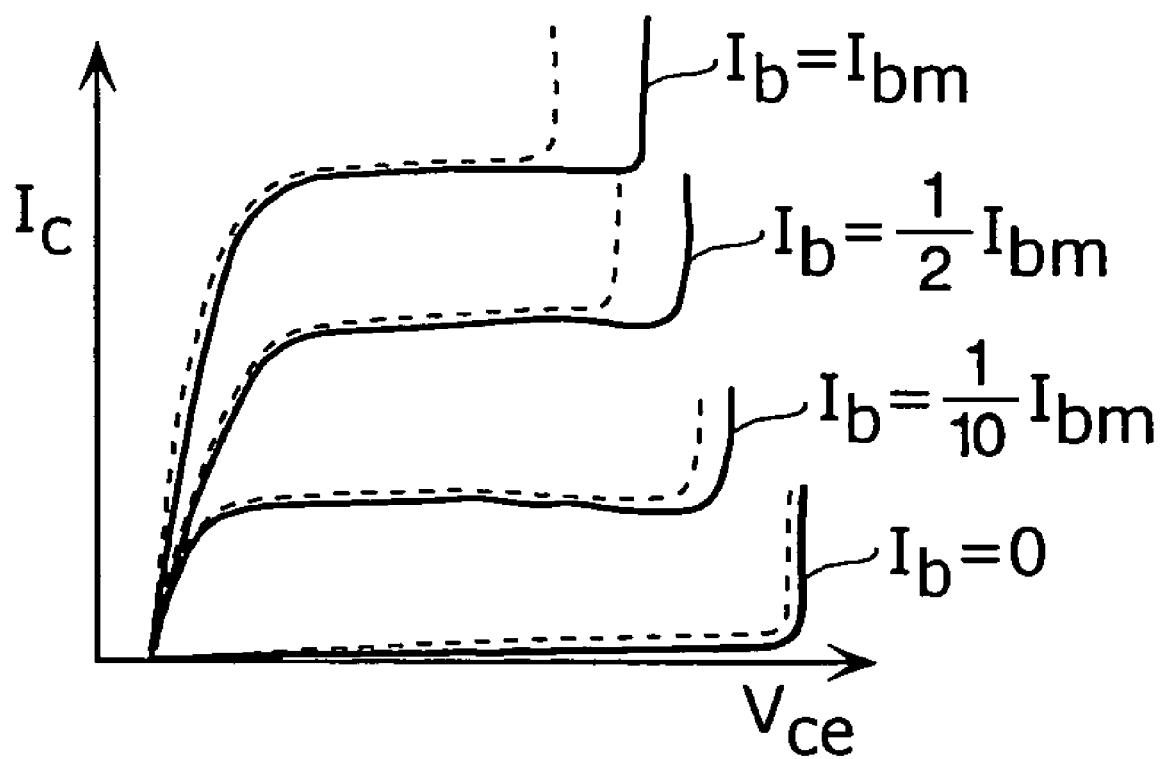
FIG. 7 is a diagram showing an $I_c$-$V_{ce}$ characteristic of the HBT in the embodiment.

FIG. 7 is a diagram showing an $I_c$-$V_{ce}$ characteristic with grounded emitter. At this time, in FIG. 7, the $I_c$-$V_{ce}$ characteristic is seen at $I_b$ which is different points at 0, $I_{bm}/10$, $I_{bm}/2$, and $I_{bm}$. The $I_{bm}$ is the maximum value of the $I_b$ in FIG. 2A. Also, the broken line indicates the $I_c$-$V_{ce}$ characteristic of the conventional HBT and the solid line indicates the $I_c$-$V_{ce}$ characteristic of the HBT in the present embodiment.

FIG. 7 shows that, compared to the conventional HBT, $V_{ce}$ at the time of breakdown of the HBT in the present embodiment is higher so as to improve the breakdown voltage. Also, a difference of breakdown voltage between the conventional HBT and the HBT of the present embodiment becomes larger as $I_c$ gets higher. The difference is marked particularly at the $I_{bm}$ (maximum value).

As described above, according to the HBT of the present embodiment, the intermediate collector layer 102 is formed between the subcollector layer 101 and the collector layer 103 and the concentration of impurities in the intermediate collector layer 102 is higher than that in the collector layer 103 and is lower than that in the subcollector layer 101. Consequently, a generation of the maximum electric field in the subcollector layer with high current and the occurrence of the avalanche breakdown are prevented. Therefore, the HBT of the present embodiment can realize the HBT having the improved breakdown voltage on high power output.

Here, in the HBT of the present embodiment, the intermediate collector layer 102 is made of GaAs as similar to the subcollector layer 101 and the collector layer 103. However, the intermediate collector layer is not limited to GaAs, and can be made of other semiconductor materials such as InGaP or InGaAsP insofar as the semiconductor materials whose band gap is larger than that of GaAs which is the material of the subcollector layer and the collector layer. Accordingly, a carrier generation rate is lowered and the occurrence of the avalanche breakdown is prevented so that the HBT having further improved breakdown voltage can be realized.

Figure 8A:
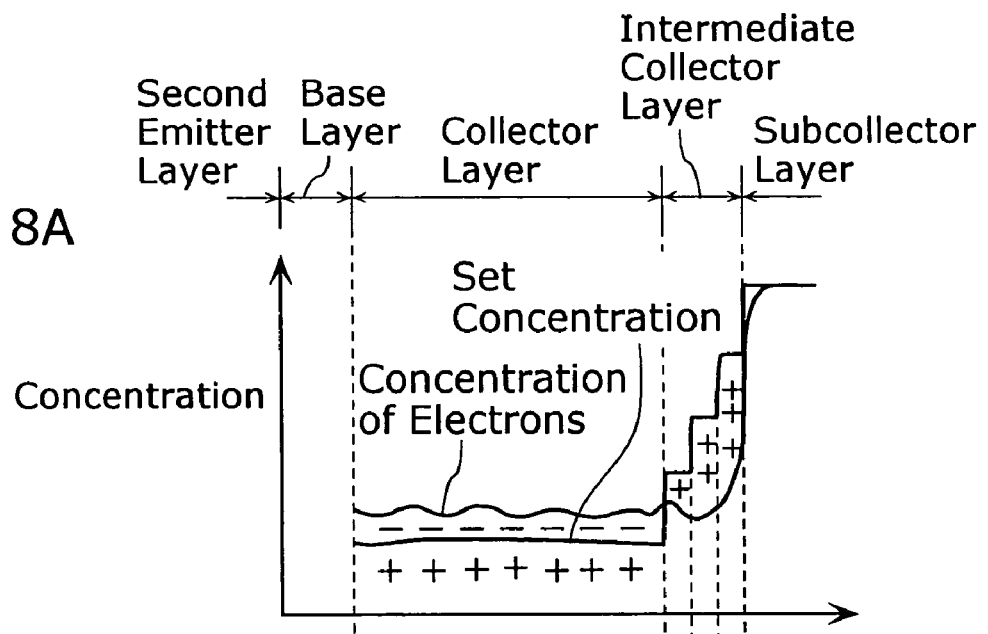
FIG. 8A is a diagram indicating, when current is high, the set concentration and the concentration of electrons in the intermediate collector layer and the collector layer of the HBT in the embodiment.
Figure 8B:
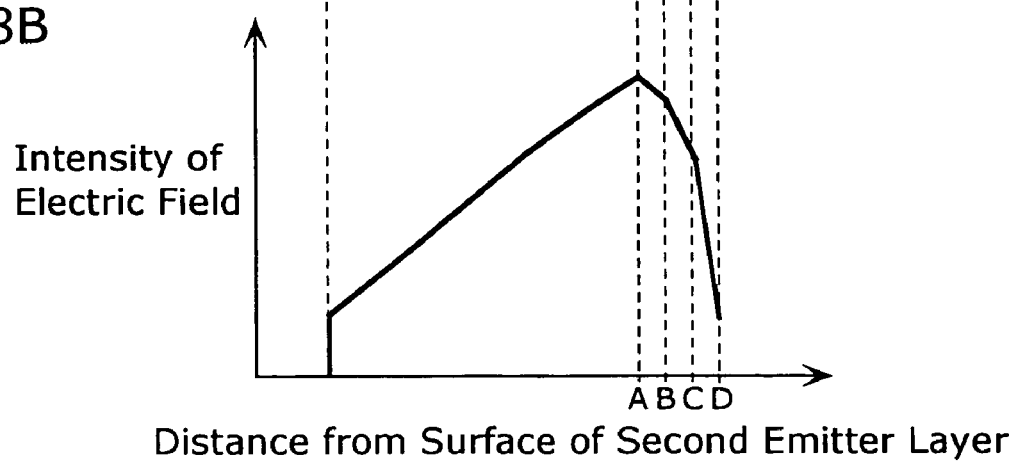
FIG. 8B is a diagram indicating, when current is high, the intensity of the electric field (absolute value) in the intermediate collector layer and the collector layer of the HBT in the embodiment.

Further, in the HBT of the present embodiment, the concentration of impurities in the intermediate collector layer 102 is constant. However, the concentration of impurities in the intermediate collector layer can be higher from the surface of the intermediate collector layer facing to the collector layer toward the surface of the intermediate collector layer facing to the subcollector layer in a stepwise manner or a continuous manner. For example, the concentration of the impurities in the intermediate collector layer may be changed in three steps of $5 \times 10^{16}$ cm$^{-3}$, $2 \times 10^{17}$ cm$^{-3}$, and $5 \times 10^{17}$ cm$^{-3}$, by dividing from the surface of the intermediate collector layer facing to the collector layer toward the surface of the intermediate collector layer facing to the subcollector layer respectively at 500 Å, 1000 Å, and 1500 Å. FIGS. 8A and 8B explain about a state inside the device when the HBT having the above mentioned structure breaks down.

FIG. 8A is a diagram indicating a set concentration and a concentration of electrons in the device when current is high. FIG. 8B is a diagram indicating an intensity of an electric field (absolute value) in the device when current is high. In FIG. 8A, the horizontal axis indicates a distance from the surface of the second emitter layer and the ordinate axis indicates the concentrations. In FIG. 8B, the horizontal axis indicates a distance from the surface of the second emitter layer and the ordinate axis indicates the intensity of the electric field. Note that, the points A, B, C and D in FIGS. 8A and 8B respectively indicate the point of the interface between the collector layer and the intermediate collector layer, the point where the concentration of impurities changes for the first time, the point where the concentration of impurities changes for the second time, and the point of the interface between the intermediate collector layer and the subcollector layer.

FIG. 8A shows that, when current is high, the set concentration is lower than the concentration of electrons in the collector layer and that inside the collector layer is charged in negative. On the other hand, the set concentrations at the points A, B, C and D in the intermediate collector layer are respectively higher than the concentrations of the electrons and that inside the intermediate collector layer is charged in positive.

FIG. 8B shows that, when current is high, the gradient largely changes at the points B and C in the intermediate collector layer and that, compared to the case where the concentration of impurities in the intermediate collector layer is low and constant as in FIG. 6A, the intensity of the electric field at the interface between the subcollector layer and the intermediate collector layer is lowered. That is, the avalanche breakdown is further unlikely to occur. Further, compared to the case where the concentration of impurities in the intermediate collector layer is high and constant, the gradient of the electric field from the points A to C is moderated due to the low concentration so that the area of the electric field becomes larger and the breakdown voltage can be improved. Further, in the case where the concentration of electrons in the intermediate collector layer is higher than the set concentration between the points A and B, the maximum electric field is generated at the point B and the gradient largely changes at point C.

As described above, by increasing the concentration of impurities in the intermediate collector layer from the surface of the intermediate collector layer facing to the collector layer toward the surface of the intermediate collector layer facing to the subcollector layer in a stepwise manner or a continuous manner, the intensity of the electric field can be strengthened at the point with low concentration of electrons; the intensity of electric field at the point with high concentration of electrons can be lowered; and the breakdown voltage with high current can be improved. Consequently, the occurrence of the avalanche breakdown is further prevented so that the HBT having further improved breakdown voltage on high power output can be realized.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

The present invention can be used for a heterojunction bipolar transistor, in particular for a communication transmitting high power amplifier and the like used in a cellular phone and the like.

What is claimed is:

1. A semiconductor device that is a heterojunction bipolar transistor, said semiconductor device comprising:
    a collector layer;
    a subcollector layer; and
    an intermediate collector layer formed between said collector layer and said subcollector layer,
    wherein said collector layer and said subcollector layer are made of GaAs,
    wherein said intermediate collector layer is made of a semiconductor material whose band gap is larger than a band gap of GaAs, the semiconductor material of said intermediate collector layer being different than a semiconductor material of said collector layer,
    wherein a concentration of impurities in said intermediate collector layer is higher than a concentration of impurities in said collector layer and is lower than a concentration of impurities in said subcollector layer, and
    wherein the concentration of impurities in said intermediate collector layer is higher in a direction from a surface of said intermediate collector layer facing to said collector layer toward a surface of said intermediate layer facing to said subcollector layer.

2. The semiconductor device according to claim 1, further comprising:
    a base layer that is formed on said collector layer and is made of GaAs;
    a second emitter layer that is formed on said base layer and is made of InGaP;
    a first emitter layer that is formed on said second emitter layer and is made of GaAs;
    a contact layer that is formed on said first emitter layer and is made of InGaAs;
    an emitter electrode formed on said contact layer;
    a base electrode formed on said base layer; and
    a collector electrode formed on said subcollector layer,
    wherein said intermediate collector layer is made of one of InGaP and InGaAsP.

3. The semiconductor device according to claim 2, wherein the concentration of impurities in said intermediate collector layer changes step by step from the surface of said intermediate collector layer facing to said collector layer toward the surface of said intermediate collector layer facing to said subcollector layer.

4. The semiconductor device according to claim 2, wherein a thickness of said intermediate collector layer is one-third of less of a thickness of said collector layer.

5. The semiconductor device according to claim 1, wherein the concentration of impurities in said intermediate collector layer changes step by step from the surface of said intermediate collector layer facing to said collector layer toward the surface of said intermediate collector layer facing to said subcollector layer.

6. The semiconductor device according to claim 5, wherein a thickness of said intermediate collector layer is one-third or less of a thickness of said collector layer.

7. The semiconductor device according to claim 1, wherein the concentration of impurities in said intermediate collector layer is higher in a direction from a surface of said intermediate collector layer facing to said collector layer toward a surface of said intermediate layer facing to said subcollector layer.

8. The semiconductor device according to claim 1, wherein the concentration of impurities in said intermediate collector layer changes step by step from the surface of said intermediate collector layer facing to said collector layer toward the surface of said intermediate collector layer facing to said subcollector layer.

9. The semiconductor device according to claim 1, wherein a thickness of said intermediate collector layer is one-third or less of a thickness of said collector layer.

* * * * *